(12) United States Patent
Kim et al.

(10) Patent No.: US 8,390,364 B2
(45) Date of Patent: Mar. 5, 2013

(54) INTERNAL VOLTAGE GENERATION CIRCUIT FOR SEMICONDUCTOR APPARATUS

(75) Inventors: Ki Han Kim, Gyeonggi-do (KR); Hyun Woo Lee, Gyeonggi-do (KR); Won Joo Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 141 days.

(21) Appl. No.: 12/843,995

(22) Filed: Jul. 27, 2010

(65) Prior Publication Data
US 2011/0204951 A1    Aug. 25, 2011

(30) Foreign Application Priority Data
Feb. 25, 2010 (KR) .................. 10-2010-0017289

(51) Int. Cl.
  *G05F 1/10* (2006.01)
(52) U.S. Cl. .................. 327/530; 327/540; 713/322
(58) Field of Classification Search .................. 327/530; 713/322
  See application file for complete search history.

(56) References Cited

U.S. PATENT DOCUMENTS

| | | | |
|---|---|---|---|
| 6,169,434 B1 | 1/2001 | Portmann | |
| 6,349,399 B1 | 2/2002 | Manning | |
| 6,490,224 B2 | 12/2002 | Manning | |
| 6,525,585 B1 * | 2/2003 | Iida et al. | 327/279 |
| 6,643,790 B1 | 11/2003 | Yu et al. | |
| 6,801,989 B2 | 10/2004 | Johnson et al. | |
| 6,868,503 B1 * | 3/2005 | Maksimovic et al. | 713/401 |
| 6,912,680 B1 | 6/2005 | Keeth | |
| 7,085,975 B2 | 8/2006 | Manning | |
| 7,221,131 B2 * | 5/2007 | Ozawa et al. | 323/272 |
| 7,248,197 B2 | 7/2007 | Watanabe | |
| 7,319,358 B2 * | 1/2008 | Senthinathan et al. | 327/538 |
| 7,345,460 B2 * | 3/2008 | Ma et al. | 323/283 |
| 7,461,286 B2 | 12/2008 | James | |
| 7,501,868 B2 * | 3/2009 | Ito | 327/158 |
| 7,574,562 B2 * | 8/2009 | Shen et al. | 711/118 |
| 7,602,166 B1 * | 10/2009 | Kang | 323/283 |
| 7,714,600 B2 * | 5/2010 | Hasumi et al. | 324/764.01 |
| 7,921,312 B1 * | 4/2011 | Pennanen et al. | 713/300 |
| 7,965,133 B2 * | 6/2011 | Anidjar et al. | 327/544 |
| 2003/0030483 A1 * | 2/2003 | Seki et al. | 327/540 |
| 2007/0103356 A1 | 5/2007 | Makino et al. | |
| 2008/0129341 A1 * | 6/2008 | Mochizuki | 326/86 |
| 2009/0267579 A1 * | 10/2009 | Kim et al. | 323/273 |

FOREIGN PATENT DOCUMENTS

KR    1020090008940 A    1/2009

* cited by examiner

*Primary Examiner* — Thomas J Hiltunen
(74) *Attorney, Agent, or Firm* — Ladas & Parry LLP

(57) ABSTRACT

A semiconductor apparatus for generating an internal voltage includes a control code output block and an internal voltage generation block. The control code output block is configured to output a variable code having a code value corresponding to a voltage level of an internal voltage. The internal voltage generation block is configured to compare the variable code to a setting code and controls the voltage level of the internal voltage according to the comparison.

10 Claims, 5 Drawing Sheets

FIG.5
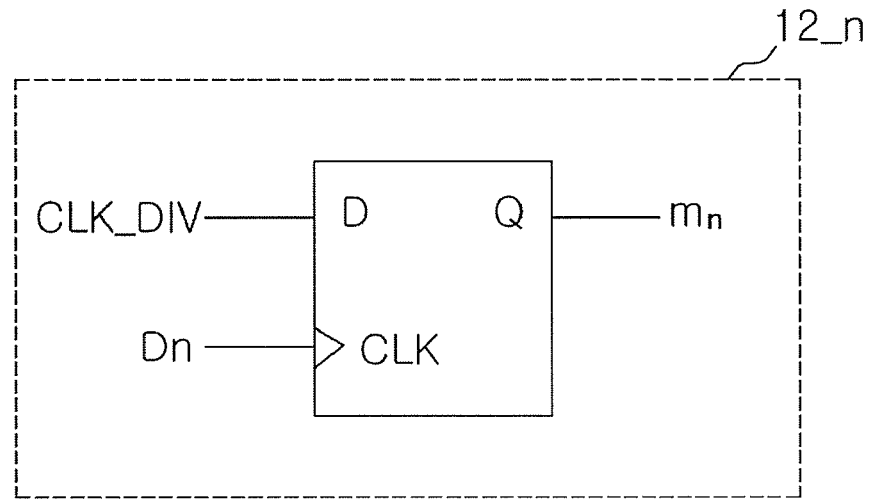
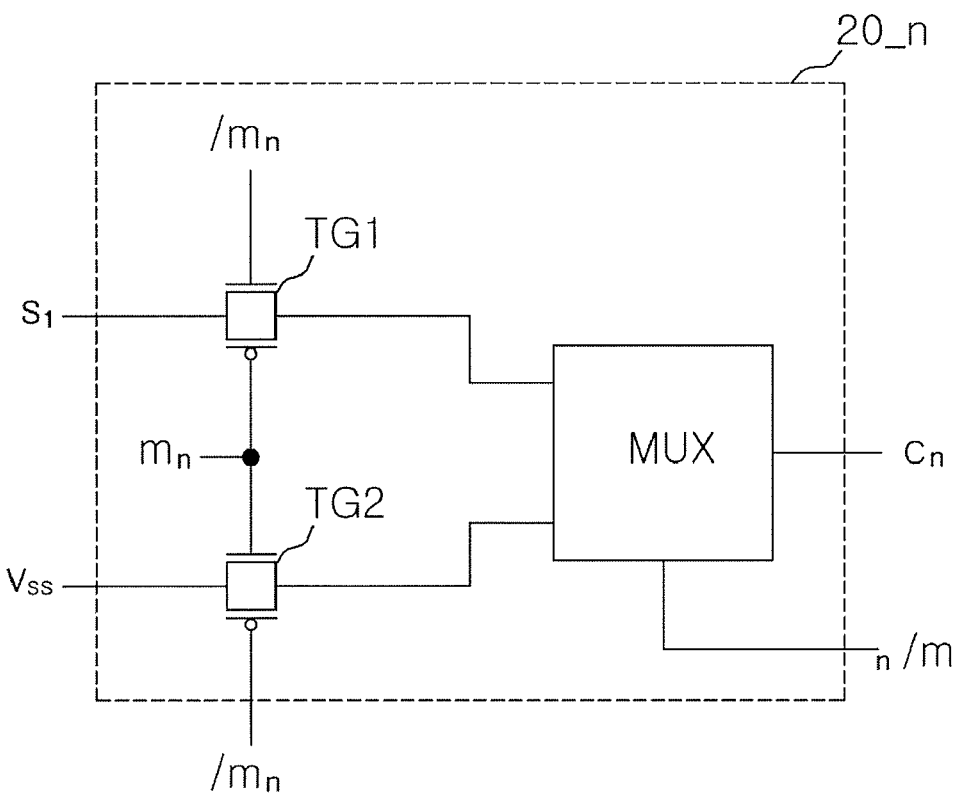

INTERNAL VOLTAGE GENERATION CIRCUIT FOR SEMICONDUCTOR APPARATUS

CROSS-REFERENCES TO RELATED APPLICATION

The present application claims priority under 35 U.S.C. §119(a) to Korean application No. 10-2010-0017289, filed on Feb. 25, 2010, in the Korean Intellectual Property Office, which is incorporated herein by reference in its entirety as set forth in full.

BACKGROUND

The present invention relates generally to a semiconductor apparatus, and more particularly, to internal voltage generation technology.

A semiconductor apparatus typically includes an internal voltage generation circuit that utilizes an externally applied power supply voltage to generate an internal voltage. Such an internal voltage generation circuit should facilitate reduced power consumption and effective use of power of the semiconductor apparatus.

FIG. 1 is a diagram showing changes in internal voltage of a conventional semiconductor apparatus.

Referring to FIG. 1, when the level of a power supply voltage VDD increases in a state in which power is not stabilized, an internal voltage VINT generated by an internal voltage generation circuit of the conventional semiconductor apparatus increases in correspondence to the increase of the level of the power supply voltage VDD. Once the power supply voltage VDD has reached a target voltage level, the internal voltage VINT will maintain a constant voltage level. As shown in FIG. 1, although the power supply voltage VDD increases to a voltage level greater than that of the target voltage level, the voltage level of the internal voltage VINT is maintained.

Meanwhile, a semiconductor apparatus may operate in various frequency bands. The semiconductor apparatus is designed in such a manner that when operating at a high speed in a high frequency band, the semiconductor apparatus uses a relatively high internal voltage. Furthermore, when operating in a low frequency band, the semiconductor apparatus uses a relatively low internal voltage. However, since the conventional semiconductor apparatus is designed to maintain the internal voltage at a constant voltage level regardless of the operation frequency, unnecessary current consumption may occur or a target operation speed may be not satisfied, depending on the operation state.

SUMMARY

In one embodiment of the present invention, a semiconductor apparatus includes: a control code output block configured to output a variable code having a code value corresponding to a voltage level of an internal voltage; and an internal voltage generation block configured to generate the internal voltage having a voltage level corresponding to a result obtained by comparing a setting code with the variable code.

In another embodiment of the present invention, a semiconductor apparatus includes: a comparison block including a plurality of unit delay units having a controllable delay amount dependent on a voltage level of an internal voltage and configured to compare a phase of a clock signal with phases of output signals of the plurality of unit delay units in order to output comparison signals; and an internal voltage generation block configured to control the internal voltage to have a voltage level corresponding to the plurality of comparison signals.

In another embodiment of the present invention, a semiconductor apparatus includes: a first comparison block including a plurality of unit delay units having a controllable delay amount dependent on a voltage level of an internal voltage and configured to compare a phase of a clock signal with phases of output signals of the unit delay units to output a plurality of first comparison signals; a second comparison block configured to compare a plurality of setting signals with the plurality of first comparison signals to output a plurality of second comparison signals; and an internal voltage generation block configured to control the internal voltage to have a voltage level corresponding to the plurality of second comparison signals.

BRIEF DESCRIPTION OF THE DRAWINGS

Features, aspects, and embodiments are described in conjunction with the attached drawings, in which:

FIG. 5 is a diagram showing embodiments of the phase comparison unit and the second comparison block of the semiconductor apparatus shown in FIG. 3.

DETAILED DESCRIPTION

Hereinafter, a semiconductor apparatus according to the present invention will be described below with reference to the accompanying drawings through preferred embodiments. Simply for the purpose of illustration, signals and codes of the semiconductor apparatus are divided into a high level (HIGH LEVEL, H) and a low level (LOW LEVEL, L) in correspondence to a voltage level, and may, for example, be represented as '1' and '0'.

Figure 1:
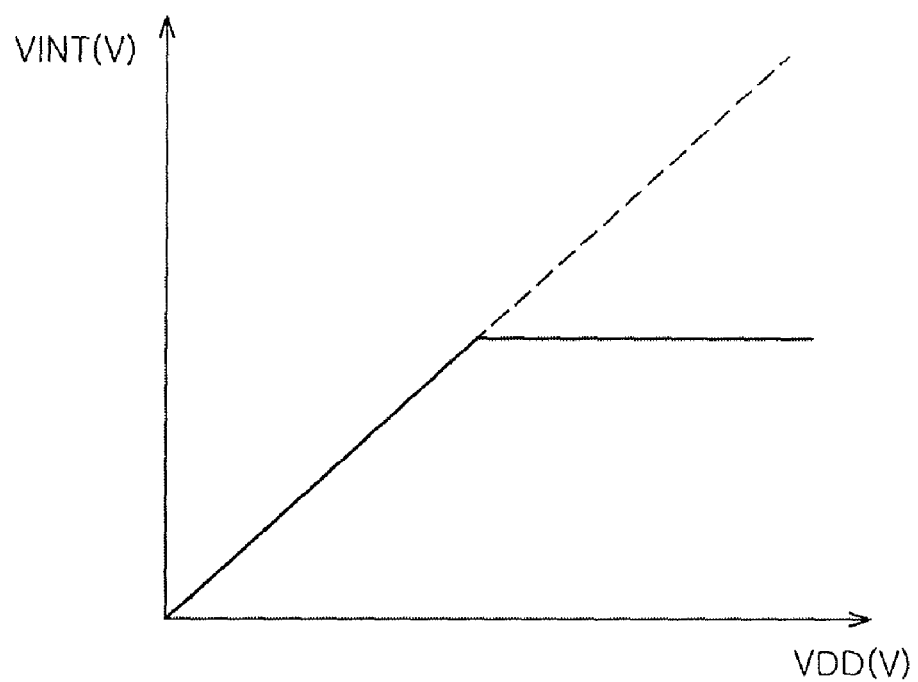
FIG. 1 is a diagram showing changes in internal voltage of a conventional semiconductor apparatus.
Figure 2:
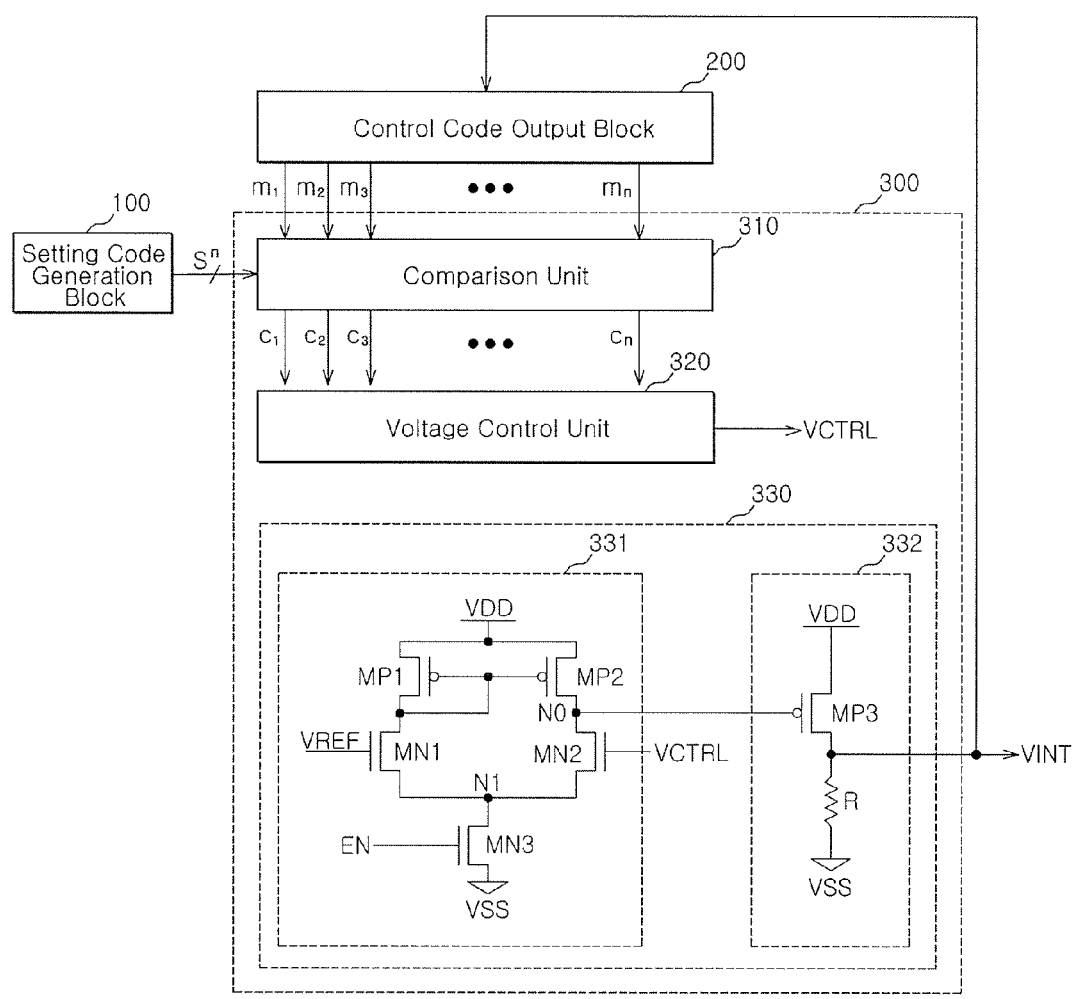
FIG. 2 is a configuration diagram of a semiconductor apparatus according to an embodiment of the present invention.

FIG. 2 is a configuration diagram of a semiconductor apparatus according to an embodiment of the present invention.

Referring to FIG. 2, the semiconductor apparatus includes a setting code generation block 100, a control code output block 200, and an internal voltage generation block 300.

The operation of the semiconductor apparatus configured in such a manner will be described as follows.

The setting code generation block 100 outputs a stored setting code and may be implemented as, for example, a latch or fuse set. In another embodiment of the present invention, the setting code generation block 100 may be omitted and the setting code S may instead be a signal outputted, for example, from a mode register set.

The control code output block 200 is configured to output a variable code $m_1$ through $m_n$ having a code value corresponding to the voltage level of an internal voltage VINT. That is, the code value of the variable code $m_1$ through $m_n$ is dependent upon the internal voltage VINT and thus can be controlled to change when the voltage level of the internal voltage changes.

The internal voltage generation block 300 is configured to generate an internal voltage VINT such that its voltage level corresponds to the result obtained by comparing the setting code S with the variable code $m_1$ through $m_n$. The internal voltage generation block 300 includes a comparison unit 310, a voltage control unit 320, and a voltage output unit 330. The comparison unit 310 is configured to compare the setting code S with the variable code $m_1$ through $m_n$ to output a plurality of comparison signals $c_1$ through $c_n$. The voltage control unit 320 is configured to output a voltage control signal VCTRL such that its voltage level corresponds to the comparison signals $c_1$ through $c_n$ outputted by the comparison unit 310. In an embodiment, the voltage control unit 320 may be configured to selectively output a plurality of internally generated voltages depending on the comparison signals $c_1$ through $c_n$. The voltage output unit 330 is configured to control the voltage level of the internal voltage. The control/adjustment of the voltage level by the voltage output unit 330 is dependent upon the voltage level of the voltage control signal VCTRL. The voltage output unit 330 includes a voltage comparator 331 and a voltage driver 332. The voltage comparator 331 is configured to compare the voltage level of the voltage control signal VCTRL to that of a reference voltage VREF. In an embodiment, the voltage comparator 331 includes current mirror sections MP1 and MP2, differential input sections MN1 and MN2 configured to receive the reference voltage VREF and the voltage control signal VCTRL respectively, and a bias section MN3 configured to supply a bias current in response to an enable signal EN. Accordingly, in the embodiment shown in FIG. 2, the voltage comparator 331 is implemented as a differential amplification circuit which compares the voltage level of the reference voltage VREF to that of the voltage control signal VCTRL. In the voltage comparator 331, as the voltage level of the inputted voltage control signal VCTRL increases, the voltage level of node N0 decreases. In an embodiment, the voltage driver 332 is implemented as a PMOS transistor MP3 which is connected between a power supply voltage terminal and an internal voltage terminal and is controlled by the voltage outputted from the node N0. Therefore, the voltage level of the internal voltage VINT output by the voltage driver 332 is dependent upon the comparison result of the voltage comparator 331, that is, through control of the voltage level of the N0 node. That is, the voltage control unit 320 increases or decreases the level of the internal voltage VINT depending on the comparison signals $c_1$ through $c_n$ obtained by the comparison between the setting code S and the variable code $m_1$ through $m_n$. Accordingly, the semiconductor apparatus according to an embodiment of the present invention compares a change in the variable code $m_1$ through $m_n$ on the basis of the setting code S, and controls the voltage level of the internal voltage VINT depending on the comparison result. At this time, the code value of the variable code $m_1$ through $m_n$ change with changes in the internal voltage since the internal voltage is fed-back to the control code output block 200.

Figure 3:
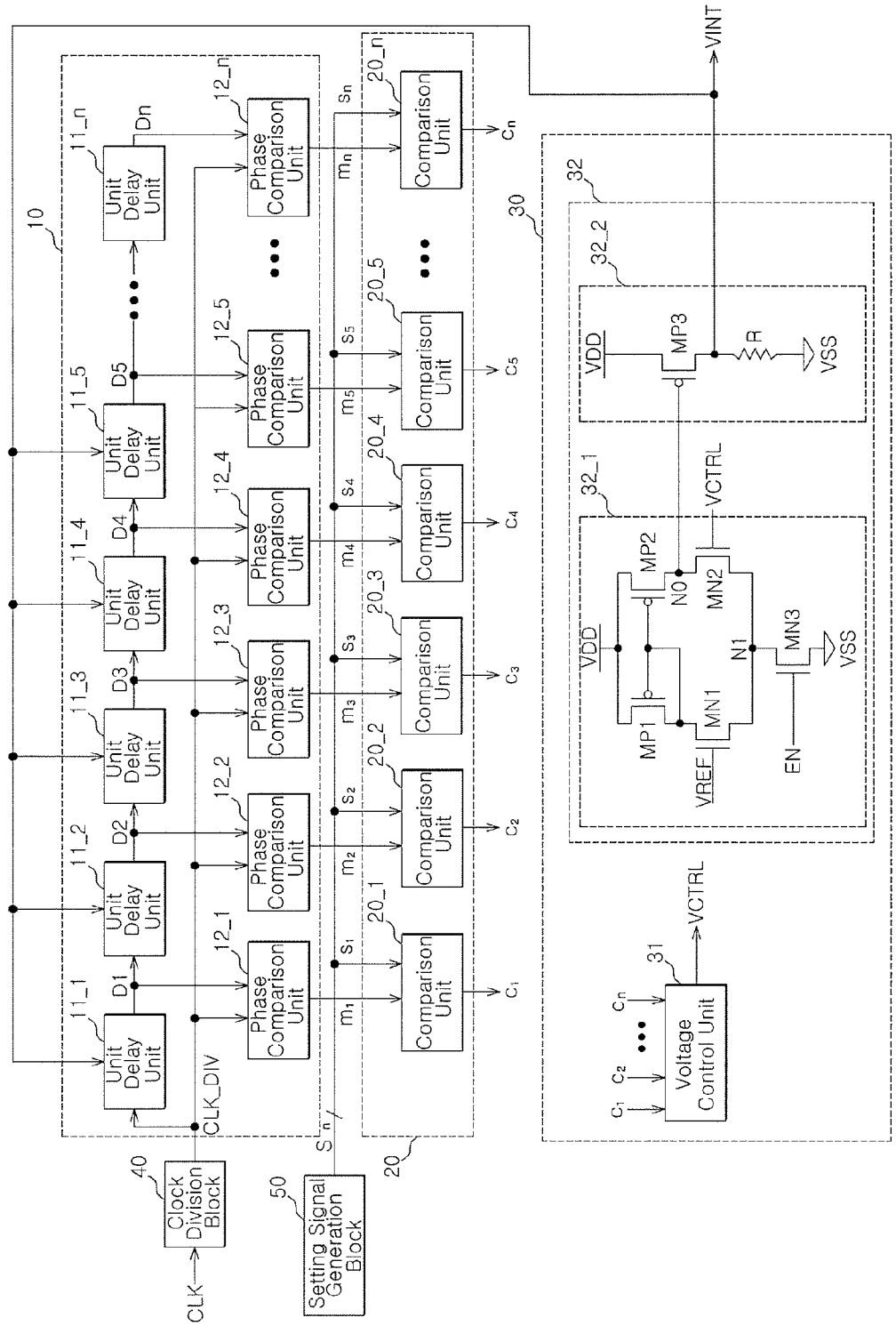
FIG. 3 is a configuration diagram of a semiconductor apparatus according to another embodiment of the present invention.

FIG. 3 is a configuration diagram of a semiconductor apparatus according to another embodiment of the present invention.

Referring to FIG. 3, the semiconductor apparatus includes a first comparison block 10, a second comparison block 20, and an internal voltage generation block 30. In an embodiment, the semiconductor apparatus may further include a clock division block 40 configured to divide an input clock signal CLK at a predetermined division ratio in order to output a divided clock signal CLK_DIV. In another embodiment, the clock division block may be omitted and a clock signal used for the operation of the first comparison block may be provided by alternative methods. Thus, the clock division block 40 is a component which may be added if necessary. Furthermore, the semiconductor apparatus may further include a setting signal generation block 50 configured to output a plurality of setting signals S. The setting signal generation block 50 may be implemented as a latch or fuse set to output a stored setting code S. In another embodiment, the setting signal generation block is not necessary and the setting code S may be provided by alternative methods, for example, as a signal outputted from a mode resistor set.

The detailed configuration and operation of the semiconductor apparatus configured in such a manner will be described as follows with reference to FIG. 3.

The clock division block 40 is configured to divide an input clock signal CLK at a predetermined division ratio so as to output a divided clock signal CLK_DIV. For the purpose of illustration, it will be assumed that the clock division block 40 performs an operation to divide the input clock signal CLK by two, although those skilled in the art will understand that alternative division ratios may be used.

The first comparison block 10 includes a plurality of unit delay units 11_1 though 11_n having a delay amount which is controlled depending on the voltage level of the internal voltage VINT. The first comparison block 10 is configured to compare the phase of the divided clock signal CLK_DIV with those of a plurality of delayed signals D1 through Dn and outputs a plurality of first comparison signals $m_1$ through $m_1$ as a result of the comparison. Each of the unit delay units 11_1 to 11_n performs a delaying operation in order to provide the delayed signals D1 through Dn. Since the plurality of first comparison signals $m_1$ through $m_n$ are signals generated by the comparison between the phase of the divided clock signal CLK_DIV and the phases of the plurality of delayed signals D1 through Dn each obtained by delaying the divided clock signal CLK_DIV, the length of one period of the input clock signal CLK can be detected through the plurality of first comparison signals $m_1$ through $m_n$. Thus, the code values of the plurality of first comparison signals $m_1$ through $m_n$ change according to the frequency change of the input clock signal CLK. The first comparison block 10 includes the plurality of unit delay units 11_1 through 11_n and a plurality of phase comparison units 12_1 through 12_n. The delay amount of each of the unit delay units 11_1 through 11_n is controlled according to the voltage level of the internal voltage VINT. That is, as the voltage level of the internal voltage VINT increases, the delay amount of a unit delay unit will decrease. On the other hand, as the voltage level of the internal voltage VINT decreases, the delay amount of the unit delay unit increases. The plurality of phase comparison units 12_1 through 12_n are configured to compare the phases of the plurality of delayed signals D1 through Dn outputted from the plurality of unit delay units 11_1 through 11_n with the phase of the divided clock signal CLK_DIV in order to output the plurality of first comparison signals $m_1$ through $m_n$.

The second comparison block 20 is configured to compare a plurality of setting signals S with the plurality of first comparison signals $m_1$ through $m_n$ in order to output a plurality of second comparison signals $c_1$ through $c_n$.

The internal voltage generation block 30 is configured to generate an internal voltage VINT having a voltage level corresponding to the plurality of second comparison signals $c_1$ through $c_n$. That is, the internal voltage generation block controls the voltage level of the internal voltage VINT according to the comparison signals $c_1$ through $c_n$. The internal voltage generation block 30 includes a voltage control unit 31 and a voltage output unit 32. The voltage control unit 31 is configured to output a voltage control signal VCTRL such that its voltage level corresponds to the plurality of second comparison signals $c_1$ through $c_n$. In an embodiment, the voltage control unit 31 may be configured to selectively output a plurality of internally generated voltages depending on the second comparison signals $c_1$ through $c_n$. Furthermore, the voltage output unit 32 is configured to control the voltage level of the internal voltage. The control/adjustment of the voltage level by the voltage output unit 32 is dependent upon the voltage level of the voltage control signal VCTRL. The voltage output unit 32 includes a voltage comparator 32_1 and a voltage driver 32_2. The voltage comparator 32_1 is configured to compare the voltage level of a reference voltage VREF to that of the voltage control signal VCTRL. In an embodiment, the voltage comparator 32_1 includes current mirror sections MP1 and MP2, differential input sections MN1 and MN2 configured to receive the reference voltage VREF and the voltage control signal VCTRL respectively, and a bias section MN3 configured to supply a bias current in response to an enable signal EN. Accordingly, in the embodiment shown in FIG. 3, the voltage comparator 32_1 is implemented as a differential amplification circuit which compares the voltage level of the reference voltage VREF to that of the voltage control signal VCTRL. In the voltage comparator 32_1, as the voltage level of the inputted voltage control signal VCTRL increases, the voltage level of node N0 decreases. In an embodiment, the voltage driver 32_2 is implemented as a PMOS transistor which is connected between a power supply voltage terminal and an internal voltage terminal and is controlled by the voltage outputted from the node N0. Therefore, the voltage level of the internal voltage VINT output by the voltage driver 32_2 is dependent upon the comparison result of the voltage comparator 32_1, that is, through control of the voltage level of the node N0. That is, the voltage level of the voltage control signal VCTRL is controlled depending on the second comparison signals $c_1$ through $c_m$ outputted by the second comparison block 20, and the voltage level of the generated internal voltage VINT is determined in accordance with control of the voltage control signal VCTRL.

Meanwhile, when the voltage level of the internal voltage VINT is controlled so as to be adjusted in accordance with the control of the voltage control signal VCTRL, the delay amount of each of the unit delay units 11_1 through 11_n included in the first comparison block 10 also changes in response to the adjusted internal voltage. As a result, the plurality of first comparison signals $m_1$ through $m_n$ are also changed. Accordingly, in an embodiment the semiconductor apparatus operates in such a manner as to equalize the plurality of first comparison signals $m_1$ through $m_n$ and the plurality of setting signals S through the control of the fed-back internal voltage VINT. In the semiconductor apparatus according to an embodiment, the voltage level of the internal voltage VINT is determined by the setting signals S, and controlled depending on the frequency change of the input clock signal CLK produced by the unit delay units 11_1 through 11_n. In the embodiment shown in FIG. 3, the delay amount of each of the unit delay units included in the first comparison block 10 is controlled depending on the voltage level of the fed-back internal voltage VINT.

Figure 4:
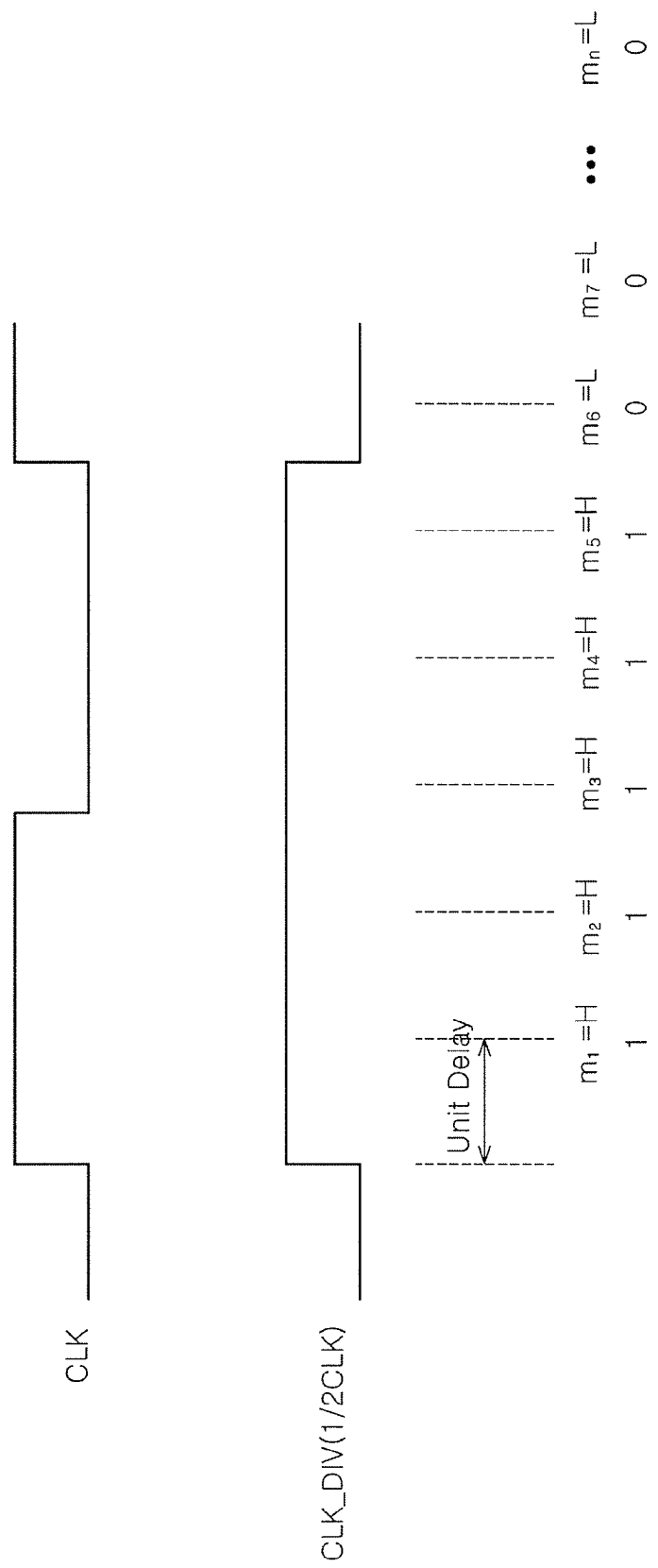
FIG. 4 is a diagram showing the internal operation of an embodiment of a first comparison block of the semiconductor apparatus shown in FIG. 3.

FIG. 4 is a diagram showing the internal operation of the first comparison block of the semiconductor apparatus illustrated in FIG. 3.

Referring to FIGS. 3 and 4, the detailed operation of the semiconductor apparatus will be described as follows.

For illustration, the internal operation will be described in a state in which it is assumed that the plurality of setting signals S is defined as '1111100 . . . 0' and the plurality of first comparison signals $m_1$ through $m_n$ is initially defined as '1111100 . . . 0'. Referring to FIG. 4, it is noted that the plurality of first comparison signals $m_1$ through $m_n$ are '1111100 . . . 0' when the length of one period of the clock signal used in the comparison operation of the phase comparison units 12 (in this case the clock signal is CLK_DIV) covers the total delay amount of the first through fifth unit delay units 11_1 through 11_5. For convenience of description, the n value will hereafter indicate that last bit in the first comparison signals $m_1$ through $m_n$ having a '1' value. Therefore, when the comparison signals are '1111100 . . . 0' the n value is five. In other words, the number of ones in the comparison signals is defined as the n value.

First, since the setting signals S and the first comparison signals $m_1$ through $m_n$ are identical to each other as '11111 00 . . . 0', the second comparison block 20 will output a comparison result in which the second comparison signals $c_1$ through $c_n$, indicate that the setting signals S and the first comparison signals $m_1$ through $m_n$ are identical to each other. At this time, the voltage level of the internal voltage VINT outputted from the internal voltage generation block 30 is maintained at the same level as the previous level fed back to the first comparison block and used to generate the first comparison signals $m_1$ through $m_n$.

Next, when the frequency of the input clock signal CLK increases so that one period shortens, the plurality of first comparison signals $m_1$ through $m_n$ outputted from the first comparison block 10 may be changed into '1100000 . . . 0'. That is, the value n decreases. Referring to FIG. 4, in this case, according to an embodiment of the present invention, the period of CLK has shortened to the extent that the divided clock signal covers only the first two unit delays, whereby the first comparison signals are changed to '1100000 . . . 00'. At this time, since the setting signals S are '1111100 . . . 0' and the first comparison signals $m_1$ through $m_n$ are '1100000 . . . 0', the first comparison signals $m_1$ through $m_n$ have a smaller n value than that of the setting signals. The second comparison block 20 outputs a comparison result in which the second comparison signals $c_1$ through $c_n$ indicate that the first comparison signals $m_1$ through $m_n$ have a smaller n value. At this time, the voltage control unit 31 of the internal voltage generation block 30 outputs a voltage control signal VCTRL having a level that causes the voltage level of the internal voltage VINT to increase. In an embodiment, the voltage level of the voltage control signal VCTRL will increase to a level higher than the previous level which in turn causes the internal voltage to increase. Therefore, the voltage output unit 32 outputs an internal voltage VINT having a higher voltage level than the previous level in accordance with the control of the voltage control signal VCTRL. When the internal voltage VINT increases, the delay amount of each of the unit delay units 11_1 through 11_n decreases. Therefore, the n value of the plurality of first comparison signals $m_1$ through $m_n$ gradually increases. The above-described operation is continued until the plurality of first comparison signals $m_1$ through $m_n$, and the plurality of setting signals S are equalized, that is, the n values are equalized.

Next, when the frequency of the input clock signal CLK decreases so that one period lengthens, the plurality of first comparison signals $m_1$ through $m_n$ outputted by the first comparison block 10 may be changed into '1111111 . . . 0'. That is, the n value increases. Referring to FIG. 4, in this case, according to an embodiment of the present invention, the period of CLK has increased to the extend that the divided clock signal covers 7 unit delays, whereby the first comparison signals are changed to '1111111 . . . 0'. At this time, since the setting signals S are '1111100 . . . 0' and the first comparison signals $m_1$ through $m_n$ are '1111111 ... 0', the first comparison signals $m_1$ through $m_n$ have a larger n value. The second comparison block 20 outputs a comparison result in which the second comparison signals $c_1$ through $c_n$ indicate that the first comparison signals $m_1$ through $m_n$ have a larger n value. At this time, the voltage control unit 31 of the internal voltage generation block 30 outputs a voltage control signal VCTRL having a level that causes the voltage level of the internal voltage VINT to decrease. In an embodiment, the voltage level of the voltage control signal VCTRL will decrease to a level less than the previous level which in turn causes the internal voltage to decrease. Therefore, the voltage output unit 32 outputs an internal voltage VINT having a lower voltage level than the previous level in accordance with the control of the voltage control signal VCTRL. When the internal voltage VINT decreases, the delay amount of each of the unit delay units 11_1 through 11_n increases. Therefore, the n value of the plurality of first comparison signals $m_1$ through $m_n$ gradually decreases. The above-described operation is continued until the plurality of first comparison signals $m_1$ through $m_n$ and the plurality of setting signals S are equalized, that is, the n values are equalized.

In short, when the frequency of the input clock signal CLK changes, the change ratio of the delay amount of the unit delay unit is constantly controlled and is used in updating the internal voltage VINT. Therefore, when the frequency of the input clock signal CLK increases, the voltage level of the internal voltage VINT also increases. Furthermore, when the frequency of the input clock signal CLK decreases, the voltage level of the internal voltage VINT also decreases. Therefore, the semiconductor apparatus may perform a stable operation without unnecessary current consumption of the internal voltage VINT.

FIG. 5 is a diagram illustrating embodiments of the phase comparison unit and the second comparison block of the semiconductor apparatus shown in FIG. 3.

Referring to FIGS. 3 and 5, in an embodiment of the present invention, the plurality of phase comparison units 12_1 through 12_n are configured as D flip-flops, each of which receives the divided clock signal CLK_DIV as an input signal and outputs an output signal in accordance with control of the corresponding delayed signal among the plurality of delayed signals D1 through Dn.

The second comparison block 20 includes a plurality of selection units configured to selectively output the plurality of setting signals S in accordance with the control of the first comparison signals $m_1$ through $m_n$. In this example, each of the selection unit comprises a transmission gate and a multiplexer.

Meanwhile, in another embodiment of the present invention the second comparison block 20 may be omitted from the semiconductor apparatus, different from the embodiment of FIG. 3. The voltage control signal VCTRL may be generated to have a voltage level corresponding to the plurality of first comparison signals $m_1$ through $m_n$, and the internal voltage VINT may be generated in accordance with the control of the voltage control signal VCTRL. In the semiconductor apparatus configured in such a manner, the voltage level of the internal voltage VINT is not determined by the plurality of setting signals S, but is directly changed depending on a frequency change of the input clock signal CLK. In such a configuration, the voltage control unit 31 may be configured to perform a control only to increase the internal voltage VINT or only to decrease the internal voltage VINT, in accordance with an internally determined reference. Alternatively, the voltage control unit 31 may be configured to perform a control in such a direction to increase and/or decrease the internal voltage VINT in accordance with an internal reference. Furthermore, the voltage control unit 31 and the voltage output unit 32 may be configured to control the internal voltage VINT within only a specific range through a plurality of voltage control signals and a plurality of references.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. An internal voltage generation circuit for a semiconductor apparatus comprising:
   a first comparison block comprising a plurality of unit delay units for delaying a clock signal by a controllable delay dependent on a voltage level of the internal voltage and configured to compare a phase of the clock signal with phases of output signals of the unit delay units in order to output a plurality of first comparison signals;
   a second comparison block configured to compare a plurality of setting signals with the plurality of first comparison signals to output a plurality of second comparison signals; and
   an internal voltage generation block configured to control a voltage level of the internal voltage in accordance with the plurality of second comparison signals.

2. The internal voltage generation circuit according to claim 1, further comprising a setting signal generation block configured to generate the plurality of setting signals.

3. The internal voltage generation circuit according to claim 2, wherein the setting signal generation block comprises a latch unit configured to store the plurality of setting signals.

4. The internal voltage generation circuit according to according to claim 1, wherein the first comparison block further comprises a plurality of phase comparison units configured to compare the phase of the clock signal with the phases of the output signals of the plurality of unit delay units.

5. The internal voltage generation circuit according to claim 1, wherein the second comparison block comprises a plurality of selection units configured to selectively output the plurality of setting signals in accordance with control of the plurality of first comparison signals.

6. The internal voltage generation circuit according to claim 1, wherein the internal voltage generation block comprises:
   a voltage control unit configured to output a voltage control signal corresponding to the plurality of second comparison signals; and
   a voltage output unit configured to output the internal voltage in accordance with control of the voltage control signal.

7. The internal voltage generation circuit according to claim 1, further comprising a clock division block configured to divide an input clock signal to output the clock signal.

8. An internal voltage generation circuit for a semiconductor apparatus comprising:
   a variable code generating unit for outputting a variable code having a code value dependent upon the internal voltage and the frequency of a clock signal; and
   an internal voltage generation block for adjusting the level of the internal voltage according to the variable code, wherein the variable code generating unit comprises:
a first comparison block for outputting a plurality of first comparison signals having values dependent upon the internal voltage and the frequency of the clock signal;
a second comparison block for comparing the values of the first comparison signals with a setting signal in order to output second comparison signals as the variable code,
wherein the first comparison block comprises:
a plurality of unit delay units for delaying the clock signal by a controllable delay amount dependent on the voltage level of the internal voltage in order to output a plurality of delay signals; and
a plurality of phase comparison units for comparing phases of the delay signals to the phase of the clock signal in order to output the plurality of first comparison signals.

9. An internal voltage generation circuit for a semiconductor apparatus comprising:
a variable code generating unit for outputting a variable code; and
an internal voltage generation block for adjusting the level of the internal voltage according to the variable code,
wherein the variable code generating unit comprises:
a first comparison block for outputting a plurality of first comparison signals having values dependent upon the internal voltage and the frequency of the clock signal;
a second comparison block for comparing the values of the first comparison signals with a setting signal in order to output second comparison signals as the variable code,
wherein the second comparison block outputs the variable code having values dependent upon the internal voltage and the frequency of the clock signal,
wherein the first comparison block comprises:
a plurality of unit delay units for delaying the clock signal by a controllable delay amount dependent on the voltage level of the internal voltage in order to output a plurality of delay signals; and
a plurality of phase comparison units for comparing phases of the delay signals to the phase of the clock signal in order to output the plurality of comparison signals.

10. The internal voltage generation circuit according to claim 8 wherein the internal voltage generation block comprises:
a voltage control unit for outputting a voltage control signal in response to the variable code; and
a voltage output unit for outputting the internal voltage in accordance with control of the voltage control signal.

* * * * *